US011081059B2

(12) United States Patent
Chang et al.

(10) Patent No.: US 11,081,059 B2
(45) Date of Patent: Aug. 3, 2021

(54) DISPLAY PANELS AND DISPLAY DEVICES

(71) Applicant: Kunshan Go-Visionox Opto-Electronics Co., Ltd., Kunshan (CN)

(72) Inventors: Miao Chang, Kunshan (CN); Weilong Li, Kunshan (CN); Siming Hu, Kunshan (CN); Zhenzhen Han, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/414,779

(22) Filed: May 16, 2019

(65) Prior Publication Data

US 2019/0272790 A1   Sep. 5, 2019

Related U.S. Application Data

(63) Continuation of application No. PCT/CN2018/113112, filed on Oct. 31, 2018.

(30) Foreign Application Priority Data

May 3, 2018  (CN) .......................... 201820652766.1

(51) Int. Cl.
*G09G 3/3266* (2016.01)
*G09G 3/3275* (2016.01)
(Continued)

(52) U.S. Cl.
CPC ....... *G09G 3/3266* (2013.01); *G02F 1/13338* (2013.01); *G09G 3/3275* (2013.01);
(Continued)

(58) Field of Classification Search
CPC .. G09G 3/3266; G09G 3/3275; G09G 3/3674; G09G 3/3685; H01L 27/3225;
(Continued)

(56) References Cited

U.S. PATENT DOCUMENTS 6,256,080 B1 * 7/2001 Colgan ............. G02F 1/133753
349/110
9,959,824 B2    5/2018 Lee et al.
(Continued)

FOREIGN PATENT DOCUMENTS

CN    105511181 A    4/2016
CN    108389881 A    8/2016
(Continued)

*Primary Examiner* — Vijay Shankar
*Assistant Examiner* — Nathaniel P Brittingham
(74) *Attorney, Agent, or Firm* — Kilpatrick Townsend & Stockton LLP

(57) ABSTRACT

A display panel including a substrate is disclosed. The substrate includes: a display area including pixel units arranged in an array and a signal line connecting the pixel units; a front surface of the substrate having the display area; a back surface of the substrate facing away from the display area; a side surface of the substrate connecting the front surface of the substrate with the back surface of the substrate; and a mounting groove recessed into the substrate from the side surface of the substrate. The display panel further includes a fan-out line disposed in the mounting groove, one end of the fan-out line is connected to the signal line, and the other end meanders from the mounting groove to the back surface of the substrate. The above display panel can achieve a narrow border display.

14 Claims, 2 Drawing Sheets

(51) Int. Cl.
*G09G 3/36* (2006.01)
*H01L 27/32* (2006.01)
*G02F 1/1333* (2006.01)
*H05K 1/18* (2006.01)

(52) U.S. Cl.
CPC ......... *G09G 3/3674* (2013.01); *G09G 3/3685* (2013.01); *H01L 27/3225* (2013.01); *H01L 27/3276* (2013.01); *H05K 1/189* (2013.01); *G02F 1/133302* (2021.01); *H05K 2201/10128* (2013.01)

(58) Field of Classification Search
CPC ................ H01L 27/3276; H05K 1/189; H05K 2201/10128; G02F 2001/133302
See application file for complete search history.

(56) References Cited

U.S. PATENT DOCUMENTS

| | | |
|---|---|---|
| 2015/0382446 A1 | 12/2015 | Kwon et al. |
| 2016/0035812 A1* | 2/2016 | Kwon ............... H01L 29/66757 257/40 |
| 2017/0200780 A1* | 7/2017 | Im ........................... G09G 3/20 |
| 2019/0050094 A1* | 2/2019 | Zeng ..................... G06F 1/1643 |

FOREIGN PATENT DOCUMENTS

| | | |
|---|---|---|
| CN | 106817451 A | 6/2017 |
| CN | 207233319 U | 4/2018 |
| KR | 20170078466 A | 7/2017 |

\* cited by examiner

DISPLAY PANELS AND DISPLAY DEVICES

CROSS-REFERENCES TO RELATED APPLICATIONS

The present application is a continuation application of International Application No. PCT/CN2018/113112, filed Oct. 31, 2018, which claims the priority to Chinese application No. 201820652766.1 filed May 3, 2018, and which are incorporated herein by reference in their entireties.

FIELD

Exemplary embodiments of the present application relate to display, and in particular to display panels and display devices.

BACKGROUND

With the continuous development of display technology, people have higher display requirements on display screens, and narrow border display devices are more and more popular. Generally, the display panel includes a display area and a non-display area disposed around the display area, and a fan-out wiring area is provided in the non-display area. However, the design of the existing fan-out wiring area will result in an excessive occupied area of the non-display area, making it difficult to achieve the narrow border display.

SUMMARY

Based on this, exemplary embodiments of the present application provide display panels and display devices in view of the problem that the existing wiring area designs lead to an excessive occupied area of the non-display area.

According to an aspect, the present application provides a display panel comprising a substrate, wherein the substrate comprises:

a display area, comprising pixel units arranged in an array and a signal line connecting the pixel units;

a front surface of the substrate, containing the display area;

a back surface of the substrate, facing away from the display area;

a side surface of the substrate, configured to connect the front surface of the substrate with the back surface of the substrate; and a mounting groove recessed into the substrate from the side surface of the substrate;

wherein the display panel further comprises a fan-out line disposed in the mounting groove, one end of the fan-out line is connected to the signal line, and the other end meanders from the mounting groove to the back surface of the substrate.

Further, in an embodiment, the front surface of the substrate comprises an upper end and a lower end opposite to the upper end, the mounting groove is disposed at the upper end of the substrate and includes a groove wall at a bottom of the groove and sidewalls distributed on both sides of the bottom.

Further, in an embodiment, the mounting groove is provided with a bonding piece, and one end of the bonding piece is connected to the substrate through the groove wall at the bottom of the mounting groove, and the other end meanders and is attached to the back surface of the substrate.

Further, in an embodiment, the bonding piece is integral with the substrate, made of a same material as the substrate, and has a same thickness as the substrate.

Further, in an embodiment, the fan-out line is disposed on the bonding piece and meanders to the back surface of the substrate along with the bonding piece.

Further, in an embodiment, the fan-out line is disposed on the bonding piece and is connected to the signal line through the bottom edge of the mounting groove.

Further, in an embodiment, the bonding piece comprises a meandering portion, and the fan-out line is provided with a through hole at the meandering portion for releasing a stress of the fan-out line when the line meanders.

Further, in an embodiment, the display area of the display panel comprises a first sub-display area, a second sub-display area, and a third sub-display area arranged between the first sub-display area and the second sub-display area, the mounting groove is located between the first sub-display area and the second sub-display area, the third sub-display area is located below the mounting groove and adjacent to a bottom edge of the mounting groove.

Further, in an embodiment, the fan-out line comprises a straight line portion and an inclined line portion, wherein the inclined line portion connects data lines of the first sub-display area, the second sub-display area and the third sub-display area, respectively, and the straight line portion is located in the bonding piece and connected to the inclined line portion.

Further, in an embodiment, the inclined line portion of the fan-out line bypasses through an upper border of the display panel to the bottom edge of the mounting groove.

Further, in an embodiment, the inclined line portion of the fan-out line passes directly through the bottom edge of the mounting groove.

Further, in an embodiment, the display panel further comprises a driving unit, one end of the fan-out line is connected to the signal line, and the other end is connected to the driving unit.

Further, in an embodiment, the display panel further comprises a flexible circuit board, the driving unit is provided on the flexible circuit board, and the fan-out line is connected to the driving unit by the flexible circuit board.

Further, in an embodiment, the mounting groove comprises a sensor disposing area.

Further, in an embodiment, the sensor may be one or more of a camera, a fingerprint recognition element, an iris recognition or an earpiece.

Further, in an embodiment, the signal line comprises a data line or a scan line.

According to another aspect, the present application provides a display device comprising the aforementioned display panel.

Further, in an embodiment, the display device further comprises a sensor disposed in the mounting groove, and the sensor includes at least one of a camera, a fingerprint recognition element, an iris recognition element and an earpiece.

In the above display panels and display devices, by arranging the fan-out line in the mounting groove, using the space of the mounting groove to bond the fan-out line to the driving unit and let the fan-out line meander to the back surface of the substrate, the space on the front surface of the substrate can be saved, so that the area occupied by the fan-out line can be reduced, the area of the display area can be increased, and the width of the border can be reduced, thereby achieving a narrow border display.

DETAILED DESCRIPTION OF THE INVENTION

In order to make the above objects, features and advantages of the present application more apparent and understood, the specific embodiments of the present application will be described in detail below. Numerous specific details are set forth in the description below in order to provide a thorough understanding of the application. However, the present application can be implemented in many other ways than those described herein, and those skilled in the art can make similar modifications without departing from the scope of the present application, and thus the present application is not limited by the specific embodiments disclosed below.

It is to be noted that when an element is referred to as being "disposed (or provided) on" another element, the element may be directly on the other element or there may be an intermediate element existed between the element and the other element. When an element is considered to be "connected" to another element, it may be directly connected to the other element or may be connected to the other element via an intermediate element. The terms "vertical", "horizontal", "left", "right", and the like, as used herein, are for illustrative purposes only and are not meant to be the only implementing mode.

All technical and scientific terms used herein have the same meaning as commonly understood by one of ordinary skill in the art to which this application applies, unless otherwise defined. The terminology used herein is for the purpose of describing specific embodiments, and is not intended to limit the present application.

Figure 1:
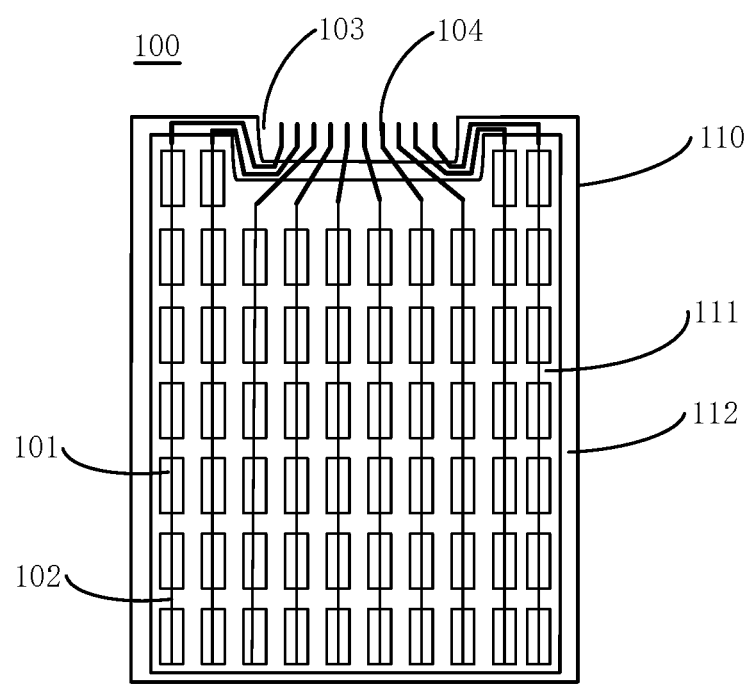
FIG. 1 is a schematic diagram of a display panel according to an embodiment of the present application.

Referring to FIG. 1 showing a display panel 100 according to an embodiment of the present application, the display panel 100 includes a substrate 110. The substrate 110 includes a display area 111 and a non-display area 112. The display area 111 includes pixel units 101 arranged in an array and a signal line 102 connecting the pixel units 101. The substrate 110 includes a front surface of the substrate having the display area 111, a back surface of the substrate facing away from the display area 111, and a side surface of the substrate connecting the front surface of the substrate with the back surface of the substrate. It can be understood that the front and back surfaces of the substrate 110 are namely the front and back surfaces of the display panel 100. The display panel 100 includes a display area and a border disposed around the periphery of the display area. The substrate 110 is further provided with a mounting groove 103 recessed into the substrate from the side surface of the substrate. The display panel 100 further includes a fan-out line 104 disposed in the mounting groove 103 and connected to the signal line 102. One end of the fan-out line 104 is connected to the signal line 102, and the other end is bent from the mounting groove 103 to the back surface of the substrate 110.

Specifically, the display area 111 is used for displaying information, and the non-display area 112 is used for setting driving elements and circuits to provide a driving signal for the display area 111. The substrate 110 is provided with a mounting groove 103 recessed into the substrate from the side surface of the substrate 110. A fan-out line 104 for connecting the signal line 102 with the driving unit may be disposed in the mounting groove 103. In this embodiment, the substrate 110 includes opposite upper and lower ends. The mounting groove 103 may be formed by recessing the side surface at the upper end of the substrate inward. It will be appreciated that the upper end and lower end are relative concepts, and in other embodiments, the upper and lower ends are also interchangeable. In this embodiment, the end with the mounting groove 103 is referred to as the upper end, and the mounting groove 103 may be located in the middle of the upper end of the substrate 110 or at an offset position at left or right.

The above display panel 100 includes a mounting groove 103 recessed from the side surface of the substrate into the substrate. Compared with scattering the fan-out lines 104 of the display panel 100 in the border of the display panel 100 in the prior art, in this embodiment the fan-out lines 104 are concentratedly placed in the area of the mounting groove 103 and connected from the area of the mounting groove 103 to the data line of the display panel 100.

Therefore, the arrangement of concentrated wiring of the fan-out line 104 of the display panel 100 provided in this embodiment may save the border space of the display panel 100 and reduce the width of the border, thereby achieving the narrow border display.

Figure 2:
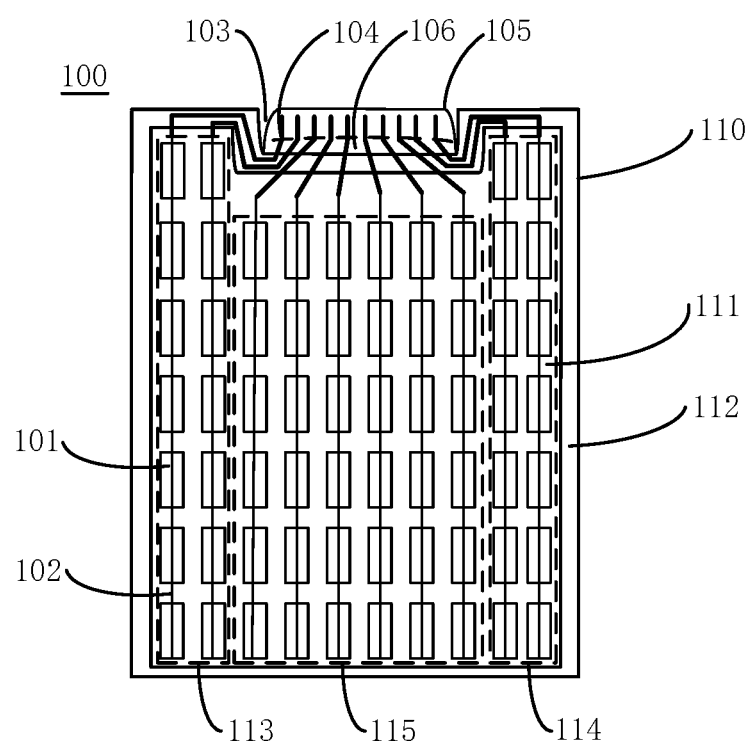
FIG. 2 is a schematic diagram of a display panel according to a specific embodiment of the present application.

Referring to FIG. 2, as an embodiment, a bonding piece 105 is disposed in the mounting groove 103, and the bonding piece 105 and the substrate 110 are meanderably (i.e. bendably and foldably) connected. Specifically, the mounting groove 103 includes an inner wall located within the substrate 110, the inner wall including a groove wall at the bottom of the groove and sidewalls on both sides of the bottom. The thickness of the inner wall of the mounting groove 103 is the same as the thickness of the substrate 110. The bonding piece 105 is located in the mounting groove 103. Optionally, the bonding piece 105 is continuously integral with the substrate 110 and has the same material and thickness as the substrate 110, that is, the bonding piece 105 has the same thickness as the inner wall of the mounting groove 103. One end of the bonding piece 105 is connected to the upper end of the substrate 110 through the groove wall at the bottom of the mounting groove 103, and the other end of the bonding piece 105 may meander and be attached to the back surface of the display panel 100. The bonding piece includes a meandering portion 106, which is parallel to the straight edge of the mounting groove 103. The bonding piece 105 meanders to the back surface of the display panel 100 by the meandering portion 106. The fan-out line 104 can be attached to the bonding piece 105 and across the meandering portion 106, and the fan-out line 104 can meander with the bonding piece 105 to the surface of the display panel 100 facing away from the display area. Certainly, the bonding piece 105 can also be connected to the substrate 110 through one side surface of the mounting groove 103 and meander to the back surface of the display panel 100. The fan-out line 104 is wired from a position where the bonding piece 105 is connected to the substrate 110.

In this embodiment, the bonding piece 105 is disposed in the mounting groove 103, and the fan-out line 104 can be disposed on the bonding piece 105. Since the bonding piece 105 meanders to the back surface of the display panel 100 through the bottom of the mounting groove 103, thus the fan-out line 104 disposed on the bonding piece 105 can meander together with the bonding piece 105 to the back surface of the display panel 100, and connected to the driving unit from the back surface of the display panel 100. After the bonding piece 105 meanders, a hollow mounting groove 103 may be formed. Functional elements and the like can be provided in the mounting groove 103. According to the display panel 100 of the present embodiment, while the capacity of the mounting groove 103 that function elements can be provided within the groove is not affected, the fan-out line 104 is wired in the mounting groove 103 and meander with the bonding piece 105 to the back surface of the display panel 100. Therefore, in this embodiment, the arrangement of the fan-out line 104 does not have to occupy the space on the front surface of the display panel 100, thereby increasing the display area and reducing the width of the border. In this embodiment, the substrate 110 originally located in the mounting groove 103 is used for bonding, and then meanders to the back surface of the display panel 100 after being bonded. Unlike the conventional arrangement of bonding area, the space of the non-display area 112 may not be occupied so that the width of the border is reduced.

As an embodiment, the fan-out line 104 has a through hole at a position where the meandering portion 106 is located. The fan-out line 104 is a transparent metal wire having a certain width and thickness. When the fan-out line 104 meanders with the meandering portion 106 to the surface of display panel 100 facing away from the display region 111, the through hole on the fan-out line 104 may release the stress of the fan-out line 104 when the fan-out line meanders, protect the fan-out line 104 located at the meandering portion 106, enhance the meandering resistance of the fan-out line 104, and reduce the influence of the meandering stress on the fan-out line 104.

As an embodiment, the fan-out line 104 is disposed on the bonding piece 105 and is connected to the signal line 102 through the bottom edge of the mounting groove 103.

In this embodiment, the signal line 102 is taken as a data line for description as an example. Specifically, the display area 111 of the display panel 100 includes a first sub-display area 113, a second sub-display area 114, and a third sub-display area 115. The mounting groove 103 may be arranged between the first sub-display area 113 and the second sub-display area 114, and the first sub-display area 113 and the second sub-display area 114 are adjacent to the sides of the mounting groove 103. Meanwhile, the third sub-display area 115 is arranged between the first sub-display area 113 and the second sub-display area 114, and abuts the first sub-display area 113 and the second sub-display area 114, and the third sub-display area 115 is located below the mounting groove 103, and adjacent to the bottom edge of the mounting groove 103.

The fan-out line 104 includes a straight line portion (vertical line portion) and an inclined line portion, the inclined line portion connects the data lines of the first sub-display area 113, the second sub-display area 114 and the third sub-display area 115, respectively, and the straight line portion is located on the bonding piece 105 and is connected to the inclined line portion. The data line of the first sub display area 113 and the second sub display area 114 is connected to the inclined line portion of the fan-out line 104, the inclined line portion connected to the data line of the first sub display area 113 and the second sub display area 114 bypasses through the upper border of the display panel 100 to the bottom edge of the mounting groove 103, and is connected to the straight line portion of the fan-out line 104 in the bonding piece 105. The data line of the third sub display area 115 is connected to the inclined line portion of the fan-out line 104, the inclined line portion connected to the data line of the third sub display area 115 is linked directly to the straight line portion of the fan-out line 104 through the bottom edge of the mounting groove 103.

In this embodiment, since the fan-out line 104 is disposed on the bonding piece 105, and one end of the bonding piece 105 is connected to substrate 110 through the bottom edge of the mounting groove 103, and the other end meanders to the back surface of the display panel 100, therefore, when the fan-out line 104 is connected to the data line in the display area 111, they are all wired from the portion of the bonding piece 105 connected to the substrate 110. After the fan-out line 104 meanders with the bonding piece 105 to the back surface of the display panel 100 through the portion of the bonding piece 105 connected to the substrate 110, the space on the front surface of the display panel 100 is not occupied, so that the display area can be increased and the width of the border can be reduced.

Certainly, the mounting groove 103 may be located at other locations on the display panel 100, for example the right or left side of upper border of the display panel 100 or the lower border of the display panel 100. In other embodiments, if the signal line 102 is a scan line, the mounting groove 103 may also be located on the left and right side borders of the display panel 100.

As an embodiment, the display panel 100 further includes a driving unit. The driving unit is located on the back surface of the display panel 100. The fan-out line 104 is connected to the driving unit through a flexible circuit board. Specifically, the flexible circuit board is bonded to the substrate 110 by the bonding piece 105. The driving unit is disposed on a flexible circuit board, and the fan-out line 104 is electrically connected to the flexible circuit board, so that the fan-out line 104 may be connected to the driving unit. The driving unit provides a signal to the signal line through the fan-out line 104.

In this embodiment, after the fan-out line 104 meanders with the bonding piece 105 to the back surface of the display panel 100, the fan-out line is connected to the driving unit on the back surface of the display panel 100. The bonding piece 105 meanders to the back surface of the display panel 100 for bonding, so that the space on the front surface of the display panel 100 is not necessary to be occupied, thereby increasing the display area and reducing the width of the border.

As an embodiment, after the bonding piece 105 meanders and is attached to the surface of the display panel 100 facing away from the display area, a sensor disposing area may be provided in the mounting groove 103. The sensor may be one or more of a camera, a fingerprint recognition element, an iris recognition or an earpiece.

In this embodiment, the bonding piece 105 is disposed in the mounting groove 103 for bonding the flexible circuit board to connect the fan-out line with the driving unit. The bonding piece 105 meanders to the back of the display panel for bonding, meanwhile, a hollow mounting groove is formed after the bonding piece meanders. A sensor can be accommodated in the mounting groove 103. In this embodiment, the bonding piece 105 is disposed in the area where the sensor is accommodated, and the bonding piece 105 meanders from the mounting groove 103 to the back surface of the display panel 100 without occupying the space on the front surface of the display panel, thereby increasing the display area and reducing the width of the border.

According to another aspect, the present application provides a display device comprising the aforementioned display panel.

Furthermore, in an embodiment, the display device further comprises a sensor disposed in the mounting groove, and the sensor includes at least one of a camera, a fingerprint recognition element, an iris recognition element and an earpiece.

The technical features of the above-described embodiments may be combined in any combination. For the sake of brevity of description, all possible combinations of the technical features in the above embodiments are not described. However, as long as there is no contradiction in the combination of these technical features, it should be considered as the scope of the present specification.

The above-mentioned embodiments are merely illustrative of several embodiments of the present application, and the description thereof is more specific and detailed, but is not to be construed as limiting the scope of the claims. It should be noted that a number of variations and modifications may be made by those skilled in the art without departing from the spirit and scope of the present application. Therefore, the scope of the application should be determined by the appended claims.

The invention claimed is:

1. A display panel, comprising a substrate, the substrate comprising:
   a display area comprising pixel units arranged in an array and a signal line connecting the pixel units;
   a front surface of the substrate comprising the display area;
   a back surface of the substrate facing away from the display area;
   a side surface of the substrate connecting the front surface of the substrate with the back surface of the substrate; and
   a mounting groove recessed into the substrate from the side surface of the substrate;
   the display panel further comprising a fan-out line disposed in the mounting groove, one end of the fan-out line being connected to the signal line, and the other end meandering from the mounting groove to the back surface of the substrate,
   wherein the display area of the display panel comprises a first sub-display area, a second sub-display area, and a third sub-display area arranged between the first sub-display area and the second sub-display area, the mounting groove is located between the first sub-display area and the second sub-display area, the third sub-display area is located below the mounting groove and adjacent to a bottom edge of the mounting groove,
   wherein the mounting groove comprises a sensor disposing area,
   wherein the mounting groove comprises an inner wall located within the substrate, and a thickness of the inner wall of the mounting groove is the same as a thickness of the substrate.

2. The display panel according to claim 1, wherein:
   the front surface of the substrate comprises an upper end and a lower end opposite to the upper end, and
   the mounting groove is disposed at the upper end of the substrate and includes a groove wall at a bottom of the groove and sidewalls distributed on both sides of the bottom.

3. The display panel according to claim 1, wherein the fan-out line comprises a straight line portion and an inclined line portion, and the mounting groove is provided with a bonding piece, wherein the inclined line portion connects data lines of the first sub-display area, the second sub-display area and the third sub-display area, respectively, and the straight line portion is located in the bonding piece and connected to the inclined line portion.

4. The display panel according to claim 3, wherein the inclined line portion of the fan-out line bypasses through an upper border of the display panel to the bottom edge of the mounting groove.

5. The display panel according to claim 3, wherein the inclined line portion of the fan-out line passes directly through the bottom edge of the mounting groove.

6. The display panel according to claim 1, wherein the display panel further comprises a driving unit, one end of the fan-out line being connected to the signal line, and the other end of the fan-out line being connected to the driving unit.

7. The display panel according to claim 6, wherein the display panel further comprises a flexible circuit board, the driving unit is provided on the flexible circuit board, and the fan-out line is connected to the driving unit by the flexible circuit board.

8. The display panel according to claim 1, wherein the sensor is one or more of a camera, a fingerprint recognition element, an iris recognition or an earpiece.

9. The display panel according to claim 1, wherein the signal line comprises a data line or a scan line.

10. A display device comprising the display panel of claim 1.

11. The display device according to claim 10, wherein the display device further comprises a sensor disposed in the mounting groove, and the sensor includes at least one of a camera, a fingerprint recognition element, an iris recognition element and an earpiece.

12. The display panel according to claim 1, wherein the fan-out line is provided with a through hole at a meandering portion for releasing a stress of the fan-out line when the fan-out line meanders.

13. The display panel according to claim 1, wherein the fan-out line comprises a transparent metal wire.

14. The display panel according to claim 13, wherein the fan-out line has a certain width and thickness.

* * * * *